United States Patent
Leibowitz et al.

(10) Patent No.: US 9,083,280 B2
(45) Date of Patent: Jul. 14, 2015

(54) TECHNIQUES FOR PHASE DETECTION

(71) Applicant: Rambus Inc., Sunnyvale, CA (US)

(72) Inventors: Brian Leibowitz, San Francisco, CA (US); Hae-Chang Lee, Los Altos, CA (US); Farshid Aryanfar, Allen, TX (US); Kun-Yung Chang, Los Altos, CA (US); Jie Shen, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/452,187

(22) Filed: Aug. 5, 2014

(65) Prior Publication Data

US 2014/0340120 A1    Nov. 20, 2014

Related U.S. Application Data

(62) Division of application No. 13/505,714, filed as application No. PCT/US2010/054900 on Oct. 31, 2010, now abandoned.

(60) Provisional application No. 61/260,797, filed on Nov. 12, 2009.

(51) Int. Cl.
*H03D 13/00* (2006.01)
*H03L 7/08* (2006.01)
(Continued)

(52) U.S. Cl.
CPC .................. *H03D 13/00* (2013.01); *H03L 7/08* (2013.01); *H03L 7/085* (2013.01); *H03L 7/0814* (2013.01); *H03L 7/0816* (2013.01)

(58) Field of Classification Search
CPC ........... H03L 7/08; H03L 7/085; H03D 13/00

USPC ........ 327/2, 3, 5, 7–10, 12, 147, 156; 331/25; 375/376

See application file for complete search history.

(56) References Cited

U.S. PATENT DOCUMENTS

| | | |
|---|---|---|
| 3,633,117 A | 1/1972 | Reilly et al. |
| 4,642,573 A | 2/1987 | Noda et al. |
| 5,917,352 A | 6/1999 | Dunlap et al. |

(Continued)

FOREIGN PATENT DOCUMENTS

WO    WO-2011-046845    4/2011

OTHER PUBLICATIONS

PCT International Search Report and Written Opinion dated Jun. 21, 2011 re International Application No. PCT/US2010/054900. 9 pages.

*Primary Examiner* — Patrick O'Neill
(74) *Attorney, Agent, or Firm* — Fenwick & West LLP

(57) ABSTRACT

A phase detection circuit can include two phase detectors that each generate a non-zero output in response to input signals being aligned in phase. The input signals are based on two periodic signals. The phase detection circuit subtracts the output signal of one phase detector from the output signal of the other phase detector to generate a signal having a zero value when the periodic signals are in phase. Alternatively, a phase detector generates a phase comparison signal indicative of a phase difference between periodic signals. The phase comparison signal has a non-zero value in response to input signals to the phase detector being aligned in phase. The input signals are based on the periodic signals. An output circuit receives the phase comparison signal and generates an output having a zero value in response to the periodic signals being aligned in phase.

20 Claims, 10 Drawing Sheets

(51) Int. Cl.
*H03L 7/081* (2006.01)
*H03L 7/085* (2006.01)

(56) References Cited

U.S. PATENT DOCUMENTS

| | | |
|---|---|---|
| 6,111,470 A | 8/2000 | Dufour |
| 6,347,128 B1 | 2/2002 | Ransijn |
| 6,385,267 B1 | 5/2002 | Bowen et al. |
| 6,809,555 B1 | 10/2004 | Nguyen |
| 6,993,109 B2 | 1/2006 | Lee et al. |
| 7,202,717 B2 | 4/2007 | Keaveney et al. |
| 7,276,977 B2 | 10/2007 | Self |
| 7,298,191 B2 | 11/2007 | Wu et al. |
| 7,388,441 B2 | 6/2008 | Delzer |
| 8,013,636 B2 * | 9/2011 | Makinwa et al. .......... 327/3 |
| 2008/0061838 A1 | 3/2008 | Wang et al. |
| 2008/0265957 A1 | 10/2008 | Luong et al. |

* cited by examiner ns a divisional application of U.S. patent
TECHNIQUES FOR PHASE DETECTION

RELATED APPLICATIONS

This application is a divisional application of U.S. patent application Ser. No. 13/505,714, which has a 371(c) date of May 2, 2012 and is the U.S. National Phase Application of PCT application No. PCT/US10/54900 filed on Oct. 31, 2010, which claims the benefit of U.S. Provisional Application No. 61/260,797 filed on Nov. 12, 2009. The above applications are incorporated by reference herein.

TECHNICAL FIELD

The present invention relates to electronic circuits, and more particularly, to techniques for phase detection.

BACKGROUND

A phase detector circuit generates an output signal that is indicative of the phase difference between two periodic input signals. A zero phase detector ideally generates a zero output when the two periodic input signals are aligned in phase with each other. Zero phase detectors are used in many applications including delay-locked loops (DLLs). As data rates increase in modern data transmission systems, the DLLs in high-speed data transmission systems require faster zero phase detectors. However, conventional zero phase detectors have a modest speed limit before generating a hard failure.

High-speed zero phase detectors have complex circuit architectures that consume a large amount of power and die area. An XOR based quadrature phase detector can operate at a relatively high speed, but it generates a zero output signal when the periodic input signals are 90 degrees out of phase. Therefore, it would be desirable to provide a similarly high-speed zero phase detector that generates a zero output signal when the periodic input signals are in phase and that does not have many of the problems of conventional zero phase detectors.

It would also be desirable to provide a high-speed delay-locked loop (DLL) that converges to the point at which the periodic input signals of the phase detector are aligned in phase. In one type of DLL, the frequency of a high-speed reference clock signal is divided by an input frequency divider circuit to generate a lower speed clock signal. The lower speed clock signal is provided to the input of a low speed phase detector in the DLL. The input frequency divider circuit consumes a significant amount of power and generates a substantial amount of jitter in the output clock signal. Therefore, it would be desirable to provide a high-speed DLL that consumes less power and generates less jitter in the output clock signal.

DETAILED DESCRIPTION

As described herein, a phase detection circuit can function as a high-speed zero phase detector. The phase detection circuit does not require a large amount of die area or a large amount of power consumption. According to some embodiments, the phase detection circuit includes two high-speed phase detectors. Each of the high-speed phase detectors generates a non-zero output in response to input signals to the phase detector being aligned in phase. The input signals to the phase detectors are based on two periodic signals. The phase detection circuit subtracts the output signal of one of the phase detectors from the output signal of the other phase detector to generate a phase comparison signal having a zero value when the periodic signals are aligned in phase.

In other embodiments, a phase detection circuit includes a chopper switch circuit, a delay circuit, and a high-speed phase detector. The chopper switch circuit periodically switches input signals between outputs of the chopper switch circuit. The delay circuit delays a first output signal of the chopper switch circuit to generate a delayed signal. The high-speed phase detector compares a phase of the delayed signal with a phase of a second output signal of the chopper switch circuit to generate an output signal. The output signal of the phase detector has a non-zero value in response to the delayed signal and the second output signal of the chopper switch circuit being aligned in phase. An output signal of the phase detection circuit has a zero value in response to the input signals of the chopper switch circuit being aligned in phase.

Figure 1:
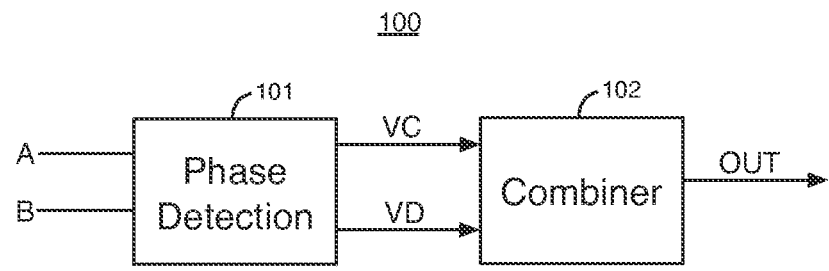
FIG. 1 illustrates an example of a circuit that generates a zero output when the phases of two periodic input signals are aligned.

FIG. 1 illustrates an example of a circuit 100 that generates a zero output when the phases of two periodic input signals are aligned. Circuit 100 has a phase detection block 101 that compares the phases of two periodic input signals A and B to generate a first phase comparison signal VC. Phase detection block 101 also compares the phases of periodic input signals A and B to generate a second phase comparison signal VD. Phase detection block 101 can include, for example, one or two constituent phase detectors that generate signals VC and VD. Each of the constituent phase detectors generates a non-zero output in response to input signals to the phase detector being aligned in phase. A combiner circuit 102 combines phase comparison signals VC and VD to generate a third phase comparison signal OUT that has a zero value when periodic input signals A and B are aligned in phase.

Figure 2A:
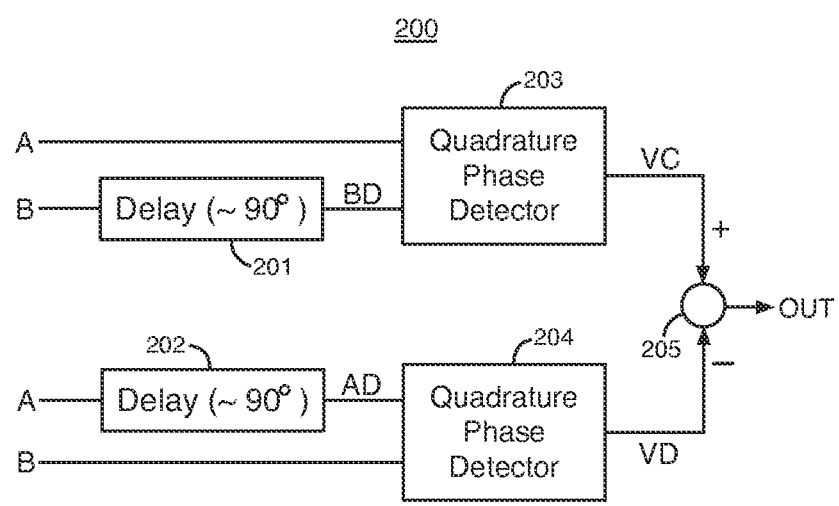
FIG. 2A illustrates an example of a high-speed phase detection circuit that uses two quadrature phase detectors and two delay circuits to generate a zero output in response to the phases of two periodic input signals being aligned.

FIG. 2A illustrates an example of a high-speed phase detection circuit that uses two quadrature phase detectors and two delay circuits to generate a zero output in response to the phases of two periodic input signals being aligned. Phase detection circuit 200 includes two delay circuits 201-202, two high-speed quadrature phase detectors 203-204, and a subtraction circuit 205. A and B represent two periodic input signals. Signals A and B can be, for example, clock signals. Signals A and B have the same frequency.

Signal A is provided to a first input of quadrature phase detector 203. Delay circuit 201 delays signal B by about 90° (i.e., about one-quarter of the period of signal B) to generate a delayed periodic signal BD that is provided to a second input of quadrature phase detector 203. Phase detector 203 generates an output phase comparison voltage signal VC that is indicative of the phase difference between input signals A and BD.

Delay circuit 202 delays signal A by about 90° (i.e., about one-quarter of the period of signal A) to generate a delayed periodic signal AD that is provided to a first input of quadrature phase detector 204. Signal B is provided to a second input of quadrature phase detector 204. Phase detector 204 generates an output phase comparison voltage signal VD that is indicative of the phase difference between input signals AD and B.

According to alternative embodiments of phase detection circuit 200, quadrature phase detectors 203-204 are replaced with phase detectors that generate zero output signals when the phases of their periodic input signals have a phase offset other than 0° or 90°, and delay circuits 201-202 have delays that equal or approximately equal the phase offset.

Figure 2B:
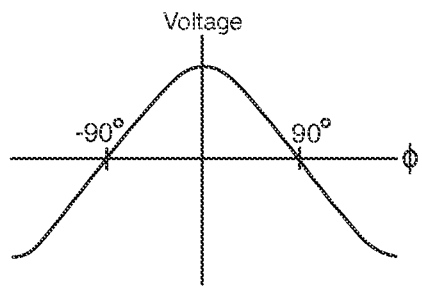
FIG. 2B is a graph of the output voltage response of a quadrature phase detector plotted over the phase difference (φ) between two periodic input signals to the quadrature phase detector.

FIG. 2B is a graph of the output voltage response of a quadrature phase detector, such as phase detectors 203 and 204, plotted over the phase difference (φ) between two periodic input signals to the quadrature phase detector. As shown in FIG. 2B, the output voltage signal of a quadrature phase detector is zero when the input signals to the quadrature phase detector have a phase difference of +90° or −90°. When the periodic input signals of a quadrature phase detector are aligned in phase (i.e., have a 0° phase difference), the output voltage signal of the phase detector reaches a peak value.

Figure 2C:
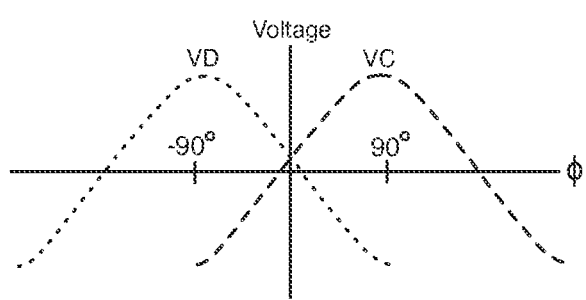
FIG. 2C is a graph that shows an example of the output voltage responses of the quadrature phase detectors in FIG. 2A plotted over the phase difference (φ) between the periodic input signals to the phase detectors.

FIG. 2C is a graph that shows an example of the output voltage responses VC and VD of quadrature phase detectors 203 and 204, respectively, plotted over the phase difference (φ) between periodic signals A and B. Because signal B is delayed by about 90° before being provided to an input of phase detector 203 as delayed signal BD, the output voltage VC of phase detector 203 reaches a peak value (i.e., an inflection point) when the phase difference between signals A and B is about 90°. When the phase difference between signals A and B is 0°, the output voltage VC of phase detector 203 is near zero. The output voltage VC of phase detector 203 may be zero when the phase difference between A and B is slightly positive or slightly negative, as shown in FIG. 2C, depending on the delay of circuit 201.

Because signal A is delayed by about 90° before being provided to an input of phase detector 204 as delayed signal AD, the output voltage VD of phase detector 204 reaches a peak value (i.e., an inflection point) when the phase difference between signals A and B is about −90°. When the phase difference between signals A and B is 0°, the output voltage VD of phase detector 204 is near zero. Output voltage VD may be zero when the phase difference between signals A and B is slightly positive, as shown in FIG. 2C, or slightly negative, depending on the delay of circuit 202.

Referring again to FIG. 2A, subtraction circuit 205 subtracts the output voltage VD of phase detector 204 from the output voltage VC of phase detector 203 to generate the output voltage signal OUT of phase detection circuit 200. Thus, VC−VD=OUT.

Figure 2D:
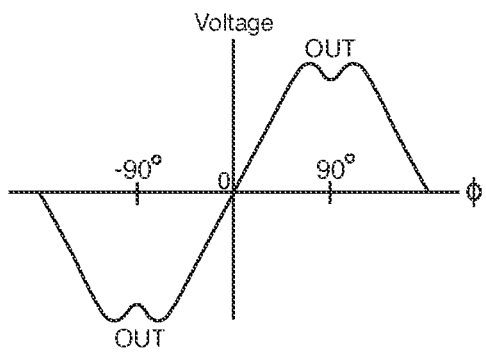
FIG. 2D is a graph that shows an example of the output voltage response of the phase detection circuit of FIG. 2A plotted over the phase difference (φ) between the periodic input signals.

FIG. 2D is a graph that shows an example of the output voltage response OUT of phase detection circuit 200 plotted over the phase difference (φ) between periodic input signals A and B. As shown in FIG. 2D, phase detection circuit 200 generates a zero output voltage in OUT in response to a phase difference of 0° between periodic input signals A and B. Phase detection circuit 200 causes output voltage OUT to be greater than zero in response to a phase difference between A and B that is between 0° and 180° (that is, periodic signal A lags periodic signal B by between 0° and 180°). Phase detection circuit 200 causes output voltage OUT to be less than zero in response to a phase difference between A and B that is between −180° and 0°. Phase detection circuit 200 uses two high-speed quadrature phase detectors 203-204 to create a circuit that functions as a high-speed zero phase detector, as shown in FIG. 2D.

Delay circuits 201-202 do not need to generate a precise delay of 90° in signals AD and BD. Phase detection circuit 200 functions as a zero phase detector that generates a zero value in OUT when A and B are aligned in phase, even if delay circuits 201-202 generate delays in BD and AD that are greater than or less than 90°. For example, phase detection circuit 200 may continue to function as a zero phase detector over a range of variations of the delay of each of circuits 201-202 from 45° to 135°. In some embodiments, phase detection circuit 200 may have an even wider zero phase detection range for variations of the delays of circuits 201-202 that are greater than +/−45°.

Delays circuits 201 and 202 have matching delays. Delay circuits 201 and 202 have the same circuit and layout designs, so that process, voltage, and temperature (PVT) variations cause the delays of circuits 201-202 to vary by the same amount. Phase detectors 203 and 204 have the same circuit and layout designs. As a result, variations in output voltages VC and VD track each other within a particular range (e.g., −45°<φ<45°). Subtraction circuit 205 cancels out PVT induced variations in VC and VD near φ=0° so that OUT continues to have a zero voltage crossing at 4=0°.

Delay circuits 201-202 can be any arbitrary delay circuits, such as, delay chains of inverters, active buffer circuits, resistor/capacitor/inductor (RLC) filter circuits, transmission lines, etc. Each of the phase detectors 203-204 can be, for example, an exclusive OR (XOR) based quadrature phase detector that generates a zero output when the phase difference between its input signals is 90°. Subtraction circuit 205 can be an analog circuit or a digital circuit.

Phase detection circuit 200 can be used in a wide variety of applications. For example, phase detection circuit 200 and other phase detection circuits described herein can be used in delay-locked loops circuits (DLLs), in phase-locked loops circuits (PLLs), in clock data recovery circuits, or in other loop circuit designs. If phase detection circuit 200 uses high-speed XOR based quadrature phase detectors 203-204, a DLL or PLL that uses phase detection circuit 200 can achieve a higher reference clock frequency than conventional zero phase detectors. A DLL or PLL using phase detection circuit 200 can, for example, be designed to increase the phase of signal B when the phase difference between signals A and B is positive, and decrease the phase of signal B when the phase difference between signals A and B is negative. In this PLL/DLL example, the phase difference between signals A and B converges to 0° when the phase difference between A and B is between −180° and 180°. The lock range for the DLL or the PLL in this example is −180°<φ<180°.

Figure 3:
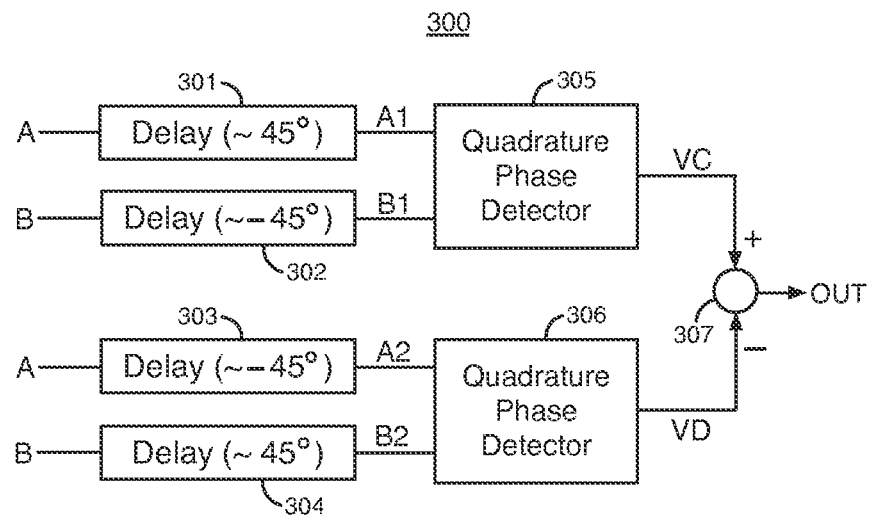
FIG. 3 illustrates another example of a phase detection circuit that uses two quadrature phase detectors to generate a zero output in response to the phases of two periodic input signals being aligned.

FIG. 3 illustrates another example of a phase detection circuit 300 that uses two quadrature phase detectors to generate a zero output in response to the phases of two periodic input signals A and B being in alignment. Phase detection circuit 300 includes four delay circuits 301-304, two quadrature phase detectors 305-306, and subtraction circuit 307.

Each of delay circuits 301 and 304 has a delay of about 45°. Each of delay circuits 302 and 303 has a delay of about −45°. A delay circuit generating a negative delay (e.g., −45°) can be constructed, for example, using LC filters. 45° refers to one-eighth of a period of input signals A and B. In an alternative embodiment of phase detection circuit 300, each of delay circuits 301 and 304 has a delay of about −45°, and each of delay circuits 302 and 303 has a delay of about 45°.

Delay circuit 301 delays input signal A by about 45° to generate delayed signal A1 at an input of phase detector 305. Delay circuit 302 delays input signal B by about −45° to generate delayed signal B1 at an input of phase detector 305. Delay circuit 303 delays input signal A by about −45° to generate delayed signal A2 at an input of phase detector 306. Delay circuit 304 delays input signal B by about 45° to generate delayed signal B2 at an input of phase detector 306.

Phase detector 305 generates an output phase comparison voltage signal VC that is indicative of the phase difference between input signals A1 and B1. Phase detector 306 generates an output phase comparison voltage signal VD that is indicative of the phase difference between input signals A2 and B2. Each quadrature phase detector 305-306 generates a zero output voltage VC/VD in response to the input signals to that quadrature phase detector having a phase difference of +90° or −90°.

Subtraction circuit 307 subtracts output voltage VD from output voltage VC to generate the output voltage signal OUT of phase detection circuit 300. Phase detection circuit 300 functions as a zero phase detector that generates a zero output when the phase difference between signals A and B is 0°, even if delay circuits 301 and 304 generate matching delays in signals A1 and B2 that are slightly greater than or slightly less than 45°, and delay circuits 302 and 303 generate matching delays in signals B1 and A2 that are slightly greater than or slightly less than −45°. The graph of FIG. 2D is also an example of the output voltage response OUT of phase detection circuit 300.

Figure 4:
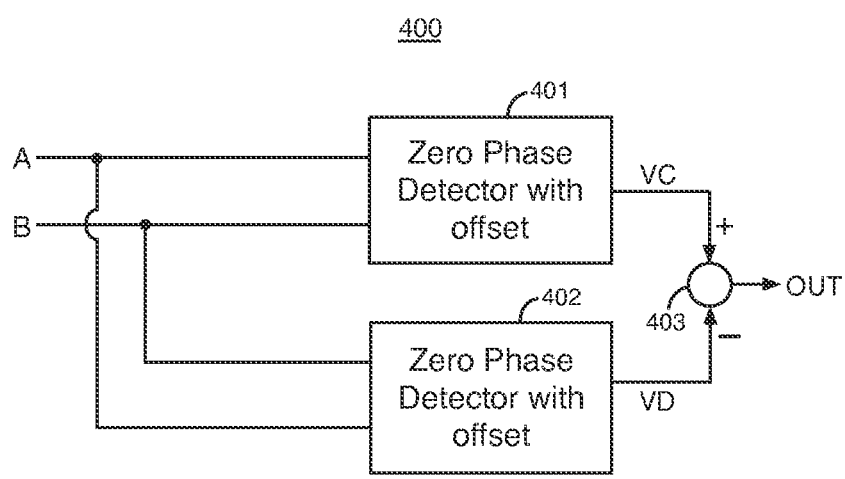
FIG. 4 illustrates an example of a phase detection circuit that uses two zero phase detectors having static phase offsets to generate a zero output in response to the phases of two periodic input signals being aligned.

FIG. 4 illustrates an example of a phase detection circuit 400 that uses two zero phase detectors having systematic non-ideal static phase offsets to generate a zero output in response to the phases of two periodic input signals A and B being aligned. Phase detection circuit 400 includes non-ideal zero phase detectors 401-402 with static offsets and subtraction circuit 403. Non-ideal phase detectors 401 and 402 generate phase comparison voltage signals VC and VD, respectively, that are indicative of the phase difference between periodic input signals A and B. Subtraction circuit 403 subtracts VD from VC to generate output signal OUT.

Non-ideal zero phase detectors 401-402 generate systematic static phase offsets in their output signals VC and VD. The static phase offsets cause detectors 401-402 to generate non-zero voltages in VC and VD in response to a phase difference of 0° between signals A and B. The detector output voltages VC and VD therefore respond as shown in FIG. 2C, with a systematic non-zero output when the input phase difference φ is 0°. However, the detector output voltages VC and VD of non-ideal phase detectors 401-402 may not peak near 90° as shown in FIG. 2C. Such non-ideal zero phase detectors may operate faster than accurate zero phase detectors without such systematic static phase offsets.

Non-ideal zero phase detectors 401-402 have the same circuit designs. As a result, PVT induced variations in the phase comparison signals VC and VD track each other, and subtraction circuit 403 cancels out the effects of these variations on output signal OUT.

Phase detection circuit 400 generates an output signal OUT having zero volts in response to a phase difference of 0° between signals A and B. Phase detection circuit 400 functions as a zero phase detector using two non-ideal zero phase detectors that do not generate zero outputs in response to the phases of their input signals being aligned.

Figure 5:
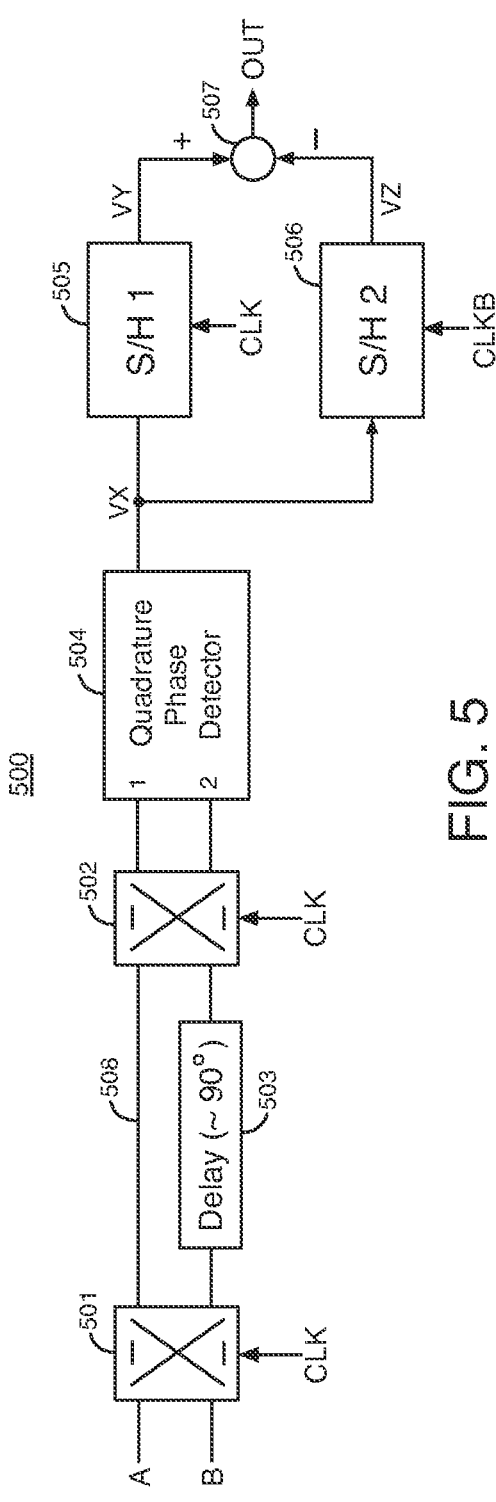
FIG. 5 illustrates an example of a phase detection circuit that functions as a zero phase detector using chopper switches, a quadrature phase detector, and sample and hold circuits.

FIG. 5 illustrates an example of a phase detection circuit 500 that functions as a zero phase detector using one or more chopper switches, a quadrature phase detector, and sample and hold circuits. Phase detection circuit 500 generates a zero output in response to two periodic input signals A and B being aligned in phase. Phase detection circuit 500 includes chopper switches 501-502, delay circuit 503, quadrature phase detector 504, sample and hold (S/H) circuits 505-506, and subtraction circuit 507.

Each of the chopper switches described herein periodically switches its input signals between the two outputs of the chopper switch in continuously alternating time periods. In circuit 500, chopper switches 501-502 alternately route periodic input signals A and B through delay circuit 503 based on the period of a digital clock signal CLK. Clock signal CLK controls the switching period and duty cycle of choppers switches 501-502. Chopper switches 501-502 eliminate the need for a second quadrature phase detector in circuit 500.

When clock signal CLK is in a first logic state, chopper switches 501-502 transmit signal A directly to the 1 input of phase detector 504 via conductor 508. Also, when CLK is in the first logic state, chopper switch 501 transmits signal B to an input of delay circuit 503, delay circuit 503 delays signal B by about 90° to generate a delayed version of signal B, and chopper switch 502 transmits the delayed version of signal B to the 2 input of phase detector 504. In this logic state, input signals A and B are connected to quadrature phase detector 504 in a manner similar to phase detector 203 in FIG. 2A.

When clock signal CLK is in a second logic state, chopper switches 501-502 transmit signal B directly to the 2 input of phase detector 504 via conductor 508. Also, when CLK is in the second logic state, chopper switch 501 transmits signal A to the input of delay circuit 503, delay circuit 503 delays signal A by about 90° to generate a delayed version of signal A, and chopper switch 502 transmits the delayed version of signal A to the 1 input of phase detector 504. In this logic state, input signals A and B are connected to quadrature phase detector 504 in a manner similar to phase detector 204 in FIG. 2A.

Quadrature phase detector 504 generates a phase comparison voltage signal VX that is indicative of the phase difference between the periodic signals at its 1 and 2 inputs. Sample and hold circuits 505 and 506 sample the voltage of signal VX to generate sampled signals VY and VZ, respectively. The sampling rates of circuits 505 and 506 are based on the timing of clock signals CLK and CLKB, respectively. Circuit 505 samples VX when CLK is in a first logic state, and circuit 506 samples VX when CLKB is in the first logic state. Clock signals CLK and CLKB are 180° out of phase with each other. Circuit 505 holds the previously sampled state of VX as signal VY when CLK is in a second logic state, and circuit 506 holds the previously sampled state of VX as signal VZ when CLKB is in the second logic state.

The sampling rate of circuits 505-506 is the same as the switching rate of chopper switches 501-502. The CLK signal typically has a lower frequency than the A and B input signals, so that after the CLK logic state changes, quadrature phase detector 504 has sufficient time to develop an accurate phase measurement before the result is sampled and the CLK logic state changes again. Sample and hold circuits 505 and 506 are intended to sample the voltage of signal VX just before the CLK logic state changes, to avoid sampling VX during a transition period. Sampling VX during a transition period can be avoided, for example, by clocking sample and hold circuits 505 and 506 using an earlier version of CLK and CLKB than is used to switch chopper switches 501 and 502.

Subtraction circuit 507 subtracts the voltage of signal VZ from the voltage of signal VY to generate output signal OUT (i.e., VY−VZ=OUT). Phase detection circuit 500 generates a zero in output signal OUT when the phase difference between periodic input signals A and B is 0°. However, the output signal OUT of circuit 500 may become discontinuous each time clock signal CLK changes state. Quadrature phase detector 504 may have a phase response as shown in FIG. 2B that is insensitive to which of the two input signals has an earlier phase and is only sensitive to the magnitude of the phase difference. Therefore, chopper switch 502 may be removed in some embodiments.

Figure 6A:
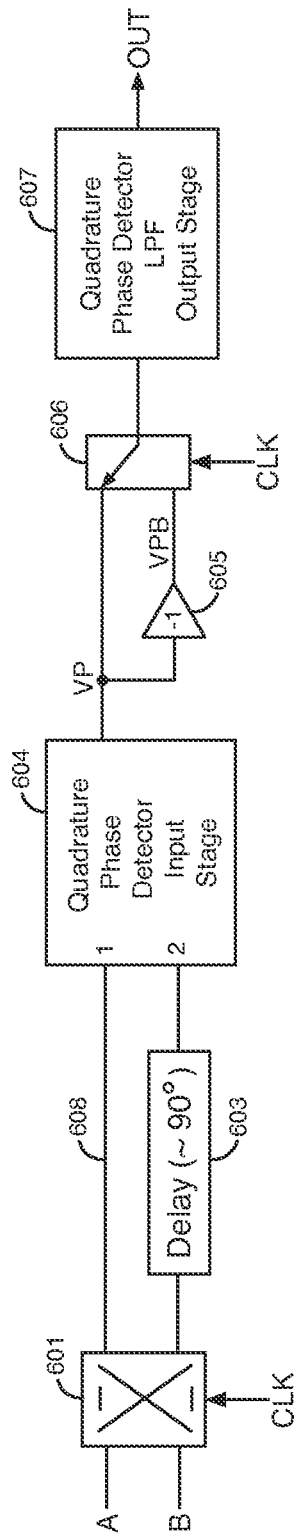
FIG. 6A illustrates an example of a phase detection circuit that generates a continuous time output signal using switches and a quadrature phase detector.

FIG. 6A illustrates an example of a phase detection circuit 600 that generates a continuous time output signal using switches and a quadrature phase detector. Phase detection circuit 600 functions as a zero phase detector that generates a zero output in response to two periodic input signals A and B being aligned in phase.

Phase detection circuit 600 includes chopper switch 601, delay circuit 603, quadrature phase detector input stage circuit 604, inverting delay circuit 605, switch 606, and quadrature phase detector low pass filter (LPF) output stage circuit 607.

A digital periodic clock signal CLK controls the switching periods and duty cycles of switches 601 and 606. When CLK is in a first logic state, chopper switch 601 transmits signal A directly to the 1 input of phase detector input stage 604 via conductor 608, and chopper switch 601 transmits signal B to an input of delay circuit 603. Delay circuit 603 delays signal B by about 90° to generate a delayed version of signal B. The delayed version of signal B is transmitted to the 2 input of phase detector input stage 604.

When CLK is in a second logic state, chopper switch 601 transmits signal A to the input of delay circuit 603, and chopper switch 601 transmits signal B directly to the 1 input of phase detector input stage 604 via conductor 608. Delay circuit 603 delays signal A by about 90° to generate a delayed version of signal A. The delayed version of signal A is transmitted to the 2 input of phase detector input stage 604.

Quadrature phase detector input stage 604 generates a phase comparison voltage signal VP that is indicative of the phase difference between the periodic signals at its 1 and 2 inputs. Quadrature phase detector input stage 604 generates a zero output voltage in VP in response to the signals at its 1 and 2 inputs being offset in phase by +/−90°. Signal VP is transmitted to an input of inverting delay circuit 605 and to a first input of switch 606. Inverting delay circuit 605 inverts signal VP to generate an inverted signal VPB (VPB=−VP) that is transmitted to a second input of switch 606.

Switch 606 transmits signals VP and VPB to an input of phase detector LPF output stage 607 in alternating time intervals in response to clock signal CLK. Phase detector LPF output stage 607 averages phase comparison signal VP and its inverse signal VPB to generate an output voltage signal OUT that is continuous in time. Circuit 600 generates a zero voltage in output signal OUT in response to a phase difference of 0° between signals A and B.

The frequency of clock signal CLK is greater than the cutoff frequency of phase detector LPF output stage 607. Phase detector LPF output stage 607 filters out the noise in signals VP and VPB that is added to these signals by the switching of switch 606 and the chopping operation of the phase detector.

Using only one quadrature phase detector in phase detection 600 and switch 601 to alternately switch A and B through delay circuit 603 eliminates the possibility of mismatches between two different phase detectors operating in parallel that can adversely affect the output response. It also removes the area needed to fabricate a second quadrature phase detector.

In one embodiment, the frequency of clock signal CLK is an integer division of the frequency of periodic signals A and B. For example, the frequency of A and B can be 4 or 8 times the frequency of CLK.

Figure 6B:
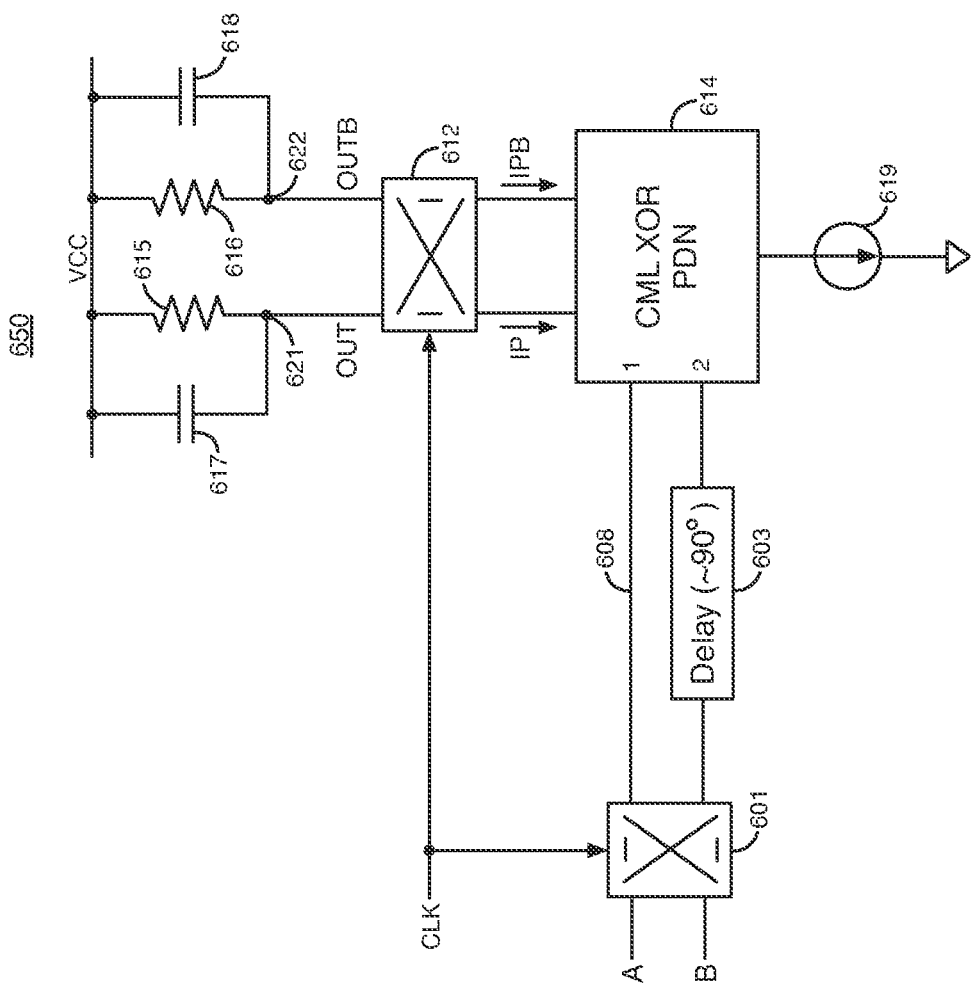
FIG. 6B illustrates one example of a current mode logic (CML) XOR circuit implementation of the phase detection circuit shown in FIG. 6A.

FIG. 6B illustrates one example of a current mode logic (CML) XOR circuit implementation of phase detection circuit 600 shown in FIG. 6A. In phase detection circuit 650 shown in FIG. 6B, phase detector input stage 604 is implemented by CML XOR pull-down network (PDN) circuit 614 and current source 619. Also in circuit 650, switch 606 is implemented by a chopper switch 612, and phase detector LPF output stage 607 is implemented by resistors 615-616 and capacitors 617-618.

Chopper switch 601 and delay circuit 603 function as described above with respect to FIG. 6A. The 1 and 2 inputs of CML XOR PDN 614 function as the 1 and 2 inputs of phase detector input stage 604. CML XOR PDN 614 compares the phases of the periodic signals at its 1 and 2 inputs to generate differential current signals IP and IPB, which serve the same purpose as voltage signals VP and VPB in FIG. 6A, but exist in the current domain. Current source 619 provides tail current for CML XOR PDN 614 and resistors 615-616.

Clock signal CLK controls the period and the duty cycle of chopper switch 612. When CLK is in a first logic state, chopper switch 612 transmits CML XOR PDN output current IP to output node 621 and output current IPB to output node 622. When CLK is in a second logic state, chopper switch 612 transmits CML XOR PDN output current IP to output node 622 and output current IPB to output node 621.

output voltages OUT and OUTB of phase detection circuit 650 are generated at output nodes 621 and 622, respectively. Output voltages OUT and OUTB function as a differential output voltage signal. Differential output signal OUT/OUTB has a zero voltage in response to a phase difference of 0° between signals A and B.

Load resistors 615 and 616 are coupled between output nodes 621 and 622, respectively, and a supply line that is at supply voltage VCC. Capacitors 617 and 618 are also coupled between output nodes 621 and 622, respectively, and the VCC supply line. Resistors 615-616 and capacitors 617-618 function as low pass filters that convert the switched output currents IP and IPB from CML XOR PDN 614 and chopper switch 612 to output voltages OUT and OUTB.

CML XOR PDN 614 can be, for example, a symmetrical or an asymmetrical pull-down network of n-channel field-effect transistors that perform an XOR Boolean logic function. CML XOR PDN 614 may generate an offset in IP and IPB that is caused by mismatches between transistors in PDN 614 or an asymmetric design of PDN 614. However, any offset caused by PDN 614 is canceled out by the averaging function performed by chopper switch 612 and the output LPF stage 615-618. Because circuit 650 can function as intended even with offsets in PDN 614, the area and the complexity of the design of PDN 614 can be reduced.

The design of phase detection circuit 650 is merely one example of an implementation of phase detection circuit 600. Phase detection circuit 600 can also be implemented using other circuit components. For example, LPF output stage 607 can be implemented using an integrator circuit.

According to an alternative embodiment of phase detection circuit 600, phase detector input stage 604 is a non-ideal zero phase detector that has a static phase offset. Delay circuit 603 is removed in this embodiment, and the second output of switch 601 is coupled directly to the 2 input of input stage 604.

Figure 7:
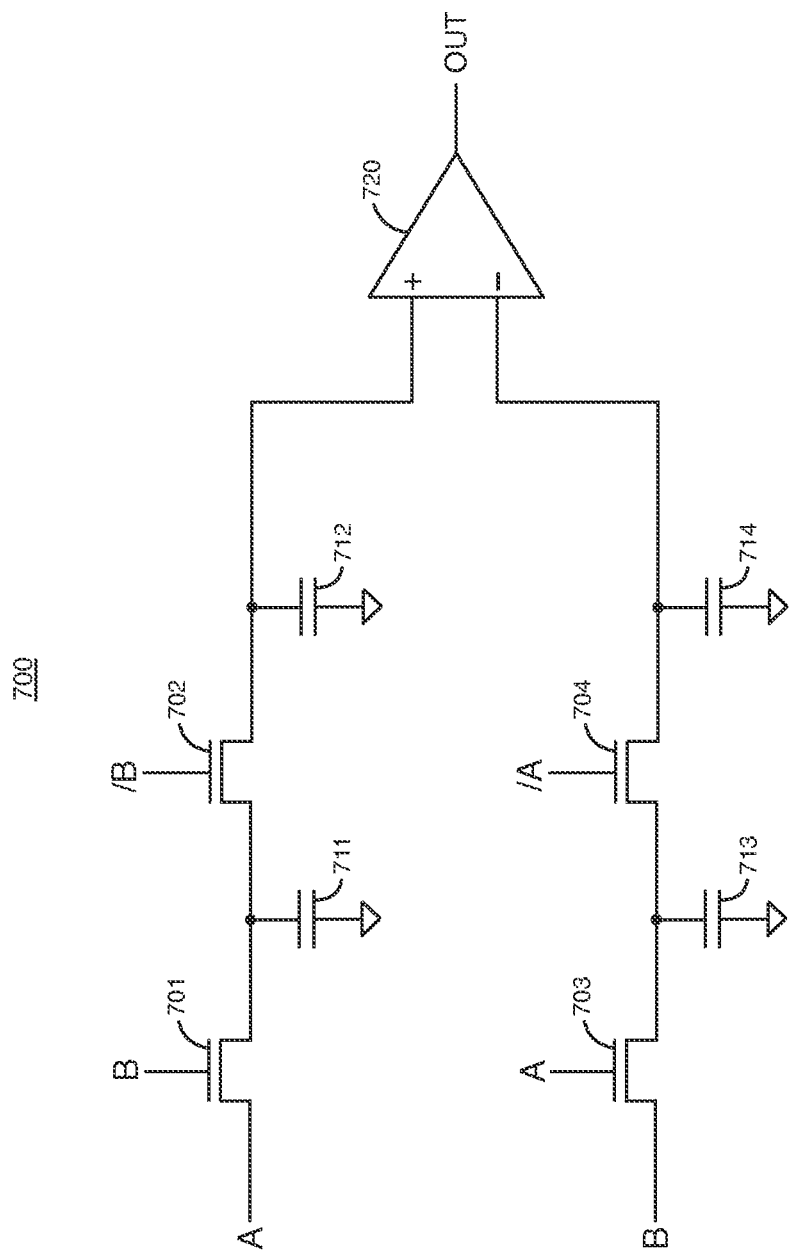
FIG. 7 illustrates an example of a phase detection circuit that samples two periodic input signals and then subtracts the sampled values to generate a phase comparison signal.

FIG. 7 illustrates another example of a phase detection circuit 700. Phase detection circuit 700 has two sample and hold circuits that sample two periodic input signals A and B. Phase detection circuit 700 filters the sampled values of the two periodic inputs signals and then subtracts the filtered sampled values to generate an output phase comparison signal. Phase detection circuit 700 functions as a zero phase detector that generates a zero output in response to periodic input signals A and B being aligned in phase.

Zero phase detector 700 includes n-channel metal oxide semiconductor field-effect transistors (MOSFETs) 701-704, capacitors 711-714, and differencing amplifier 720. Signal A is provided to a first drain/source input of transistor 701, signal B is provided to the gate of transistor 701, and inverse signal /B is provided to the gate of transistor 702. Input signals B and /B are digital periodic signals that are approximately 180° out of phase with each other.

Transistor 701 and capacitor 711 function as a first sample and hold circuit. When signal B is in a logic high state, and signal /B is in a logic low state, transistor 701 is on, transistor 702 is off, and the state of signal A is stored on capacitor 711. When signal B transitions to a low logic state, the last value of signal A is held on capacitor 711. Thus, negative transitions of signal B are used to sample and hold signal A, which also has a negative transition at the same time if A and B have a zero phase difference, forming a non-ideal zero phase detector. The finite threshold voltage of MOSFET 701, delay in sampling input signal A onto capacitor 711, and other practical limitations lead to static phase offsets in such a phase detector, but the phase detector is relatively fast and simple to implement.

Transistor 702 and capacitor 712 function as a first switched capacitor single-pole low pass filter (LPF) to filter the response of the phase detector formed by transistor 701 and capacitor 711. When signal B is in a logic low state, and signal /B is in a logic high state, transistor 701 is off, transistor 702 is on, and the voltage stored on capacitor 711 is averaged with the voltage stored on capacitor 712 based on the capacitance ratios of capacitors 711 and 712.

Capacitor 712 can have a much larger capacitance than capacitor 711. For example, the capacitance of capacitor 712 can be 100 or more times larger than the capacitance of capacitor 711. Transistor 702 and capacitor 712 attenuate high frequency components of the voltage signal stored on capacitor 712. Transistors 701-702 and capacitors 711-712 also function as a non-ideal zero phase detector having a static phase offset.

Signal B is provided to a first drain/source input of transistor 703, signal A is provided to the gate of transistor 703, and inverse signal /A is provided to the gate of transistor 704. Input signals A and /A are digital periodic signals that are approximately 180° out of phase with each other. It may be desirable to adjust the phase relationship between signals B and /B and the phase relationship between signals A and /A by using early or late phases. For example, signals /A and /B can be designed to have a duty cycle that is less than 50%.

Transistor 703 and capacitor 713 function as a second sample and hold circuit. When signal A is in a logic high state, and signal /A is in a logic low state, transistor 703 is on, transistor 704 is off, and the state of signal B is stored on capacitor 713. When signal A transitions to a low logic state, the last value of signal B is held on capacitor 713. Thus, negative transitions of signal A are used to sample and hold signal B, which also has a negative transition at the same time if A and B have a zero phase difference, forming a non-ideal zero phase detector.

Transistor 704 and capacitor 714 function as a second switched capacitor single-pole low pass filter to filter the response of the phase detector formed by transistor 703 and capacitor 713. When signal A is in a logic low state, and signal /A is in a logic high state, transistor 703 is off, transistor 704 is on, and the voltage stored on capacitor 713 is averaged with the voltage stored on capacitor 714 based on the capacitance ratios of capacitors 713 and 714.

Capacitor 714 can have a much larger capacitance than capacitor 713. For example, the capacitance of capacitor 714 can be 100 or more times the capacitance of capacitor 713. Transistor 704 and capacitor 714 attenuate high frequency components of the voltage signal stored on capacitor 714. Transistors 703-704 and capacitors 713-714 also function as a non-ideal zero phase detector having a static phase offset.

Differencing amplifier 720 amplifies the difference between the voltage stored on capacitor 712 and the voltage stored on capacitor 714 to generate an output signal OUT. Because both capacitor voltages are subject to the same static phase offset from the two non-ideal zero phase detectors, output signal OUT is a phase comparison signal having a voltage that is indicative only of the phase difference between periodic input signals A and B, and not the discussed static phase offsets. Phase detection circuit 700 generates a zero voltage in output signal OUT in response to a phase difference of 0° between signals A and B.

Phase detection circuit 700 is shown as a single-ended implementation in FIG. 7. According to another embodiment, phase detection circuit 700 can compare the phases of differential periodic input signals.

Figure 8A:
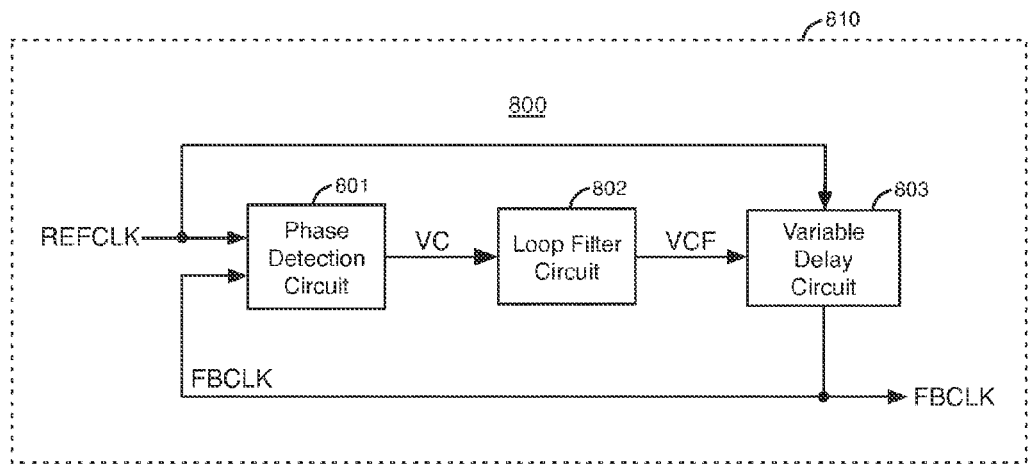
FIG. 8A illustrates an example of a delay-locked loop (DLL) circuit that can include one of the phase detection circuits shown in FIGS. 1, 2A, 3, 4, 5, 6A-6B, and 7.

The phase detection circuits shown in FIGS. 1, 2A, 3, 4, 5, 6A-6B, and 7 can be used in delay-locked loop and phase-locked loop circuits. FIG. 8A illustrates an example of a delay-locked loop (DLL) circuit 800 that can include one of the phase detection circuits shown in FIGS. 1, 2A, 3, 4, 5, 6A-6B, and 7. DLL 800 is embedded in an integrated circuit 810. DLL 800 includes phase detection circuit 801, loop filter circuit 802, and variable delay circuit 803. Phase detection circuit 801 can be one of the phase detection circuits 100, 200, 300, 400, 500, 600, 650, or 700.

Phase detection circuit 801 compares the phase of a periodic feedback clock signal FBCLK to the phase of a periodic reference clock signal REFCLK to generate a phase comparison signal VC. Signal VC is indicative of the phase difference between REFCLK and FBCLK. Loop filter circuit 802 filters the phase comparison signal VC to generate a filtered phase comparison signal VCF.

Variable delay circuit 803 delays REFCLK to generate FBCLK. Variable delay circuit 803 varies the delay provided to FBCLK relative to REFCLK based on changes in the filtered phase comparison signal VCF. DLL 800 drives the phase difference between FBCLK and REFCLK to 0°. When the phase difference between FBCLK and REFCLK is 0°, DLL 800 maintains the phase of FBCLK constant.

Figure 8B:
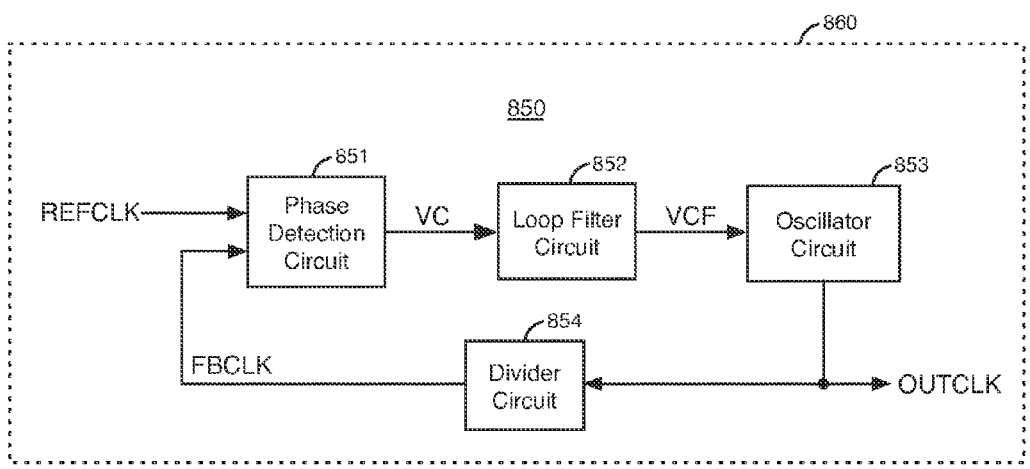
FIG. 8B illustrates an example of a phase-locked loop (PLL) circuit that can include one of the phase detection circuits shown in FIGS. 1, 2A, 3, 4, 5, 6A-6B, and 7.

FIG. 8B illustrates an example of a phase-locked loop (PLL) circuit 850 that can include one of the phase detection circuits shown in FIGS. 1, 2A, 3, 4, 5, 6A-6B, and 7. PLL 850 is embedded in an integrated circuit 860. PLL 850 includes phase detection circuit 851, loop filter circuit 852, oscillator circuit 853, and divider circuit 854. Phase detection circuit 851 can be one of the phase detection circuits 100, 200, 300, 400, 500, 600, 650, or 700.

Phase detection circuit 851 compares the phase of a periodic feedback clock signal FBCLK to the phase of a periodic reference clock signal REFCLK to generate a phase comparison signal VC. Signal VC is indicative of the phase difference between REFCLK and FBCLK. Loop filter circuit 852 filters the phase comparison signal VC to generate a filtered phase comparison signal VCF.

Oscillator circuit 853 generates a periodic output clock signal OUTCLK. Oscillator circuit 853 varies the frequency of OUTCLK based on changes in the filtered phase comparison signal VCF. Divider circuit 854 generates feedback clock signal FBCLK in response to OUTCLK. Divider circuit 854 divides the frequency of OUTCLK to generate the frequency of FBCLK. In some embodiments, divider circuit 854 is removed, and the frequency of FBCLK is equal to the frequency of OUTCLK. PLL 850 adjusts the phase and the frequency of FBCLK until FBCLK and REFCLK have the same frequency and are aligned in phase. When FBCLK and REFCLK have the same frequency and are aligned in phase, PLL 850 maintains the phase and the frequency of FBCLK constant.

Figure 9:
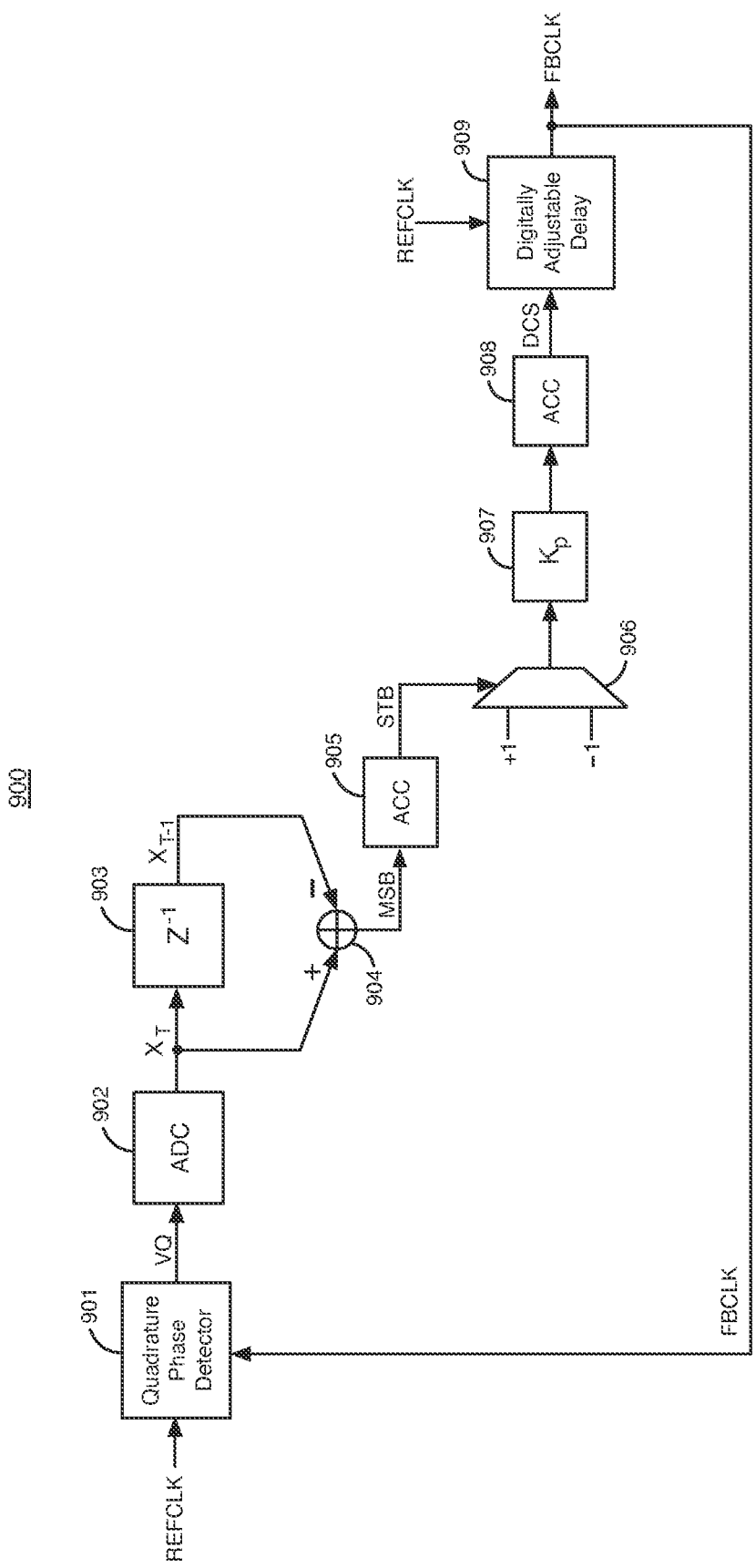
FIG. 9 illustrates an example of a delay-locked loop (DLL) circuit that aligns the phase of a feedback clock signal with the phase of a reference clock signal using a quadrature phase detector.

FIG. 9 illustrates an example of a delay-locked loop (DLL) circuit 900 that aligns the phase of a feedback clock signal FBCLK with the phase of a reference clock signal REFCLK using a quadrature phase detector. DLL 900 includes a quadrature phase detector circuit 901, an analog-to-digital converter (ADC) circuit 902, a delay circuit 903, a subtraction circuit 904, a digital accumulator (ACC) circuit 905, a multiplexer circuit 906, a digital gain circuit 907, a digital accumulator circuit 908, and digitally adjustable delay circuit 909. Circuits 903 and 904 together form a differentiator.

Quadrature phase detector 901 can be a high-speed phase detector that consumes a relatively small amount of power. Quadrature phase detector 901 compares the phase of a periodic feedback clock signal FBCLK to the phase of a periodic input reference clock signal REFCLK to generate a phase comparison signal VQ. The voltage of VQ is indicative of the phase difference between REFCLK and FBCLK. Voltage VQ may represent a single-ended or differential signal.

Quadrature phase detector 901 generates a zero voltage in VQ in response to a difference of + or −90° between the phases of FBCLK and REFCLK. REFCLK and FBCLK have the same frequency. 90° refers to one-quarter of a period of REFCLK and FBCLK. Quadrature phase detector 901 generates a peak voltage in VQ in response to a phase difference between FBCLK and REFCLK of 0°. DLL 900 is designed to cause the output voltage VQ of phase detector 901 to converge to a peak voltage that is caused by the phases of FBCLK and REFCLK being in alignment. The peak voltage in VQ occurs at an inflection point in a plot of the output response of VQ.

Phase comparison signal VQ is an analog voltage signal. ADC circuit 902 converts analog voltage VQ into a set of digital signals $X_T$. Digital signals $X_T$ are representative of the voltage of VQ. ADC 902 can use, for example, a successive approximation algorithm.

Delay circuit 903 performs a unit time interval delay function on the digital value of signals $X_T$ to generate digital signals $X_{T-1}$. Digital signals $X_{T-1}$ represent the values of signals $X_T$ at preceding time intervals. Subtraction circuit 904 subtracts signals $X_{T-1}$ from signals $X_T$ to indicate whether $X_T$ is larger or smaller than $X_{T-1}$. Thus, the result MSB of the subtraction performed by circuit 904 is indicative of the slope of phase comparison signal VQ.

The MSB output by subtraction circuit 904 is 0 if phase comparison signal VQ is increasing, and the MSB output by circuit 904 is 1 if phase comparison signal VQ is decreasing. Accumulator circuit 905 converts the MSB output of circuit 904 into a single sticky bit STB. Accumulator 905 sets the state of sticky bit STB based on the history of the MSB output of circuit 904. Sticky bit STB is transmitted to a select input of multiplexer circuit 906.

Multiplexer 906 transmits signals having a +1 value to digital gain circuit 907 when the phase comparison signal VQ has been increasing over multiple sampled values of VQ. Multiplexer 906 transmits signals having a −1 value to digital gain circuit 907 when the phase comparison signal VQ has been decreasing over multiple sampled values of VQ. Digital gain circuit 907 sets the gain of the +1 or −1 signals from multiplexer 906 to generate scaled output signals that are transmitted to accumulator 908. Accumulator 908 converts the output signals of circuit 907 into multi-bit digital control signals DCS.

Digitally adjustable delay circuit 909 delays input reference clock signal REFCLK to generate the feedback clock signal FBCLK. FBCLK and REFCLK have the same frequency. The digital control signals DCS generated by accumulator 908 control the delay that digitally adjustable delay circuit 909 adds to FBCLK relative to REFCLK. Digitally adjustable delay circuit 909 can be, for example, a phase interpolator, a resonant delay circuit, an adjustable delay chain, or any other suitable adjustable delay circuit. An example of a resonant delay circuit that can be used to implement adjustable delay circuit 909 is described in commonly-assigned U.S. provisional patent application 61/252,126, by Aryanfar et al., filed Oct. 15, 2009, which is incorporated by reference herein in its entirety.

When multiplexer circuit 906 transmits a +1 value to circuit 907, control signals DCS cause the delay of adjustable delay circuit 909 to increase. When multiplexer circuit 906 transmits a −1 value to circuit 907, control signals DCS cause the delay of adjustable delay circuit 909 to decrease.

DLL 900 causes the phase difference between FBCLK and REFCLK to converge to 0°, which causes the phase comparison signal VQ to reach a peak inflection point voltage. When the phase comparison signal VQ is decreasing, DLL 900 adjusts the phase of FBCLK to cause the phase comparison signal VQ to increase, until phase comparison signal VQ reaches a peak voltage. When the phase comparison signal VQ reaches its peak voltage, DLL 900 maintains the delay that adjustable delay circuit 909 provides to FBCLK at a constant value.

Figure 10:
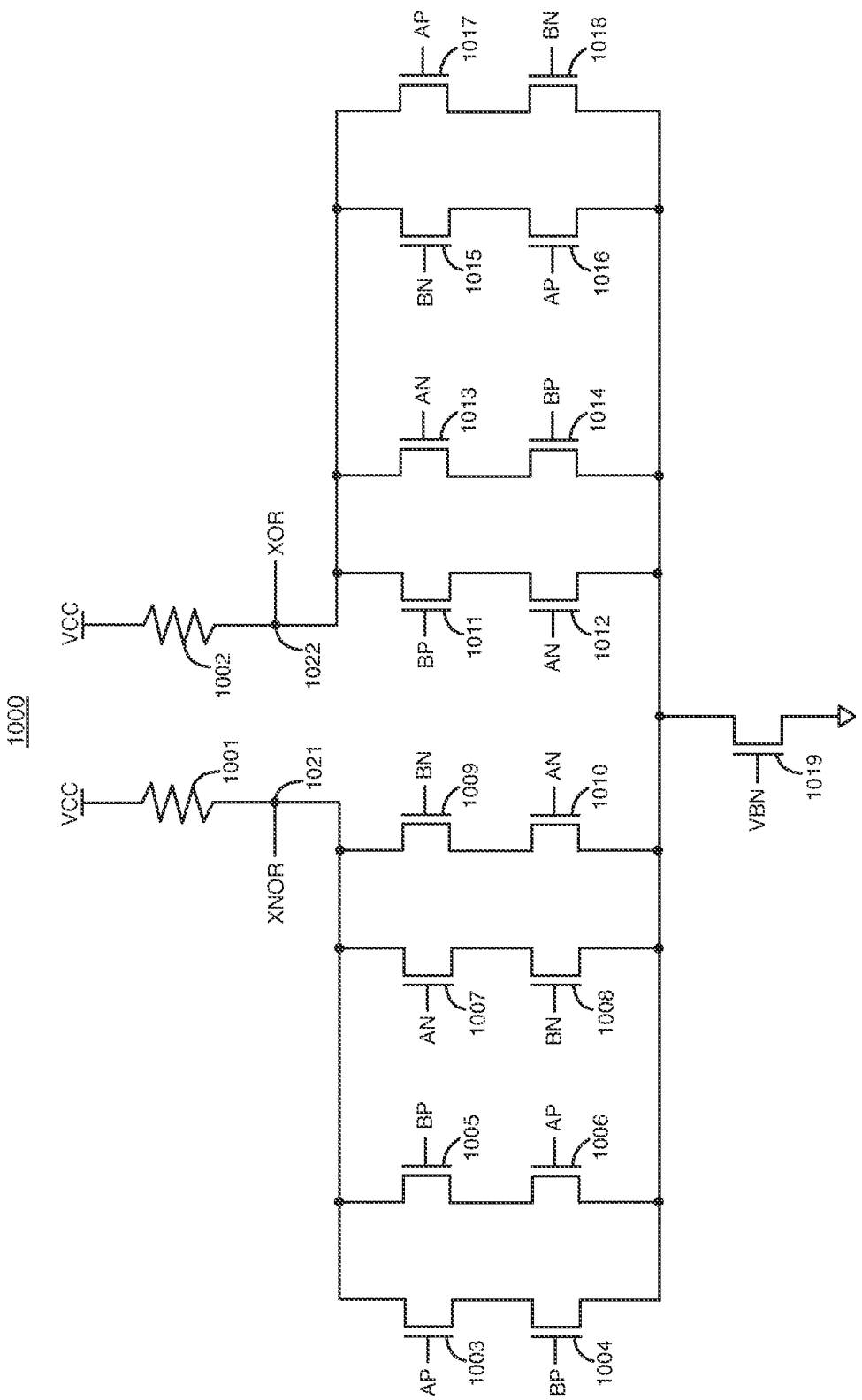
FIG. 10 illustrates a schematic diagram of a differential current mode logic (CML) XOR based phase detector circuit that can be used as a phase detector in the DLL of FIG. 9.

Quadrature phase detector 901 can be implemented, for example, by a mixer circuit or by an XOR based phase detector circuit. FIG. 10 illustrates a schematic diagram of a differential current mode logic (CML) XOR based phase detector circuit 1000 that can be used as phase detector 901 in DLL 900. Phase detector 1000 functions as a quadrature phase detector that generates a zero output when the phase difference between its two periodic input signals is +/−90°. Phase detector 1000 is a high-speed phase detector that can detect phase differences between periodic signals having large frequencies (e.g., 16 GHz). Phase detector 1000 consumes a relatively small amount of power and generates a relatively small amount of jitter in its output signals.

Phase detector 1000 includes resistors 1001-1002 and n-channel MOSFETs 1003-1019. Resistors 1001-1002 are coupled to a supply line at a supply voltage VCC. The circuit elements of phase detector 1000 are coupled together in a symmetrical configuration as shown in FIG. 10.

Phase detector 1000 receives two differential input signals. Signals AP and AN are the first differential input signal, and signals BP and BN are the second differential input signal. Signals AP, AN, BP, and BN are provided to the gates of transistors 1003-1018 as shown in FIG. 10. If phase detector 1000 is phase detector 901 in DLL 900, then differential signals AP/AN and BP/BN are periodic signals REFCLK and FBCLK. A constant bias voltage VBN is provided to the gate of transistor 1019. Transistor 1019 provides tail current for phase detector 1000.

Phase detector 1000 performs an XOR Boolean logic function on differential input signals AP/AN and BP/BN to generate differential output signal XOR/XNOR. Output voltage XOR is generated at output node 1022, and output voltage XNOR is generated at output node 1021.

According to some embodiments, phase detectors 101, 203 and 204, 305 and 306, 504, and 604/607 can be implemented using CML XOR based phase detector 1000. According to other embodiments, phase detectors 101, 203 and 204, 305 and 306, 504, and 604/607 can be implemented using an asymmetrical CML XOR based phase detector circuit design having less transistors than phase detector 1000.

Figure 11:
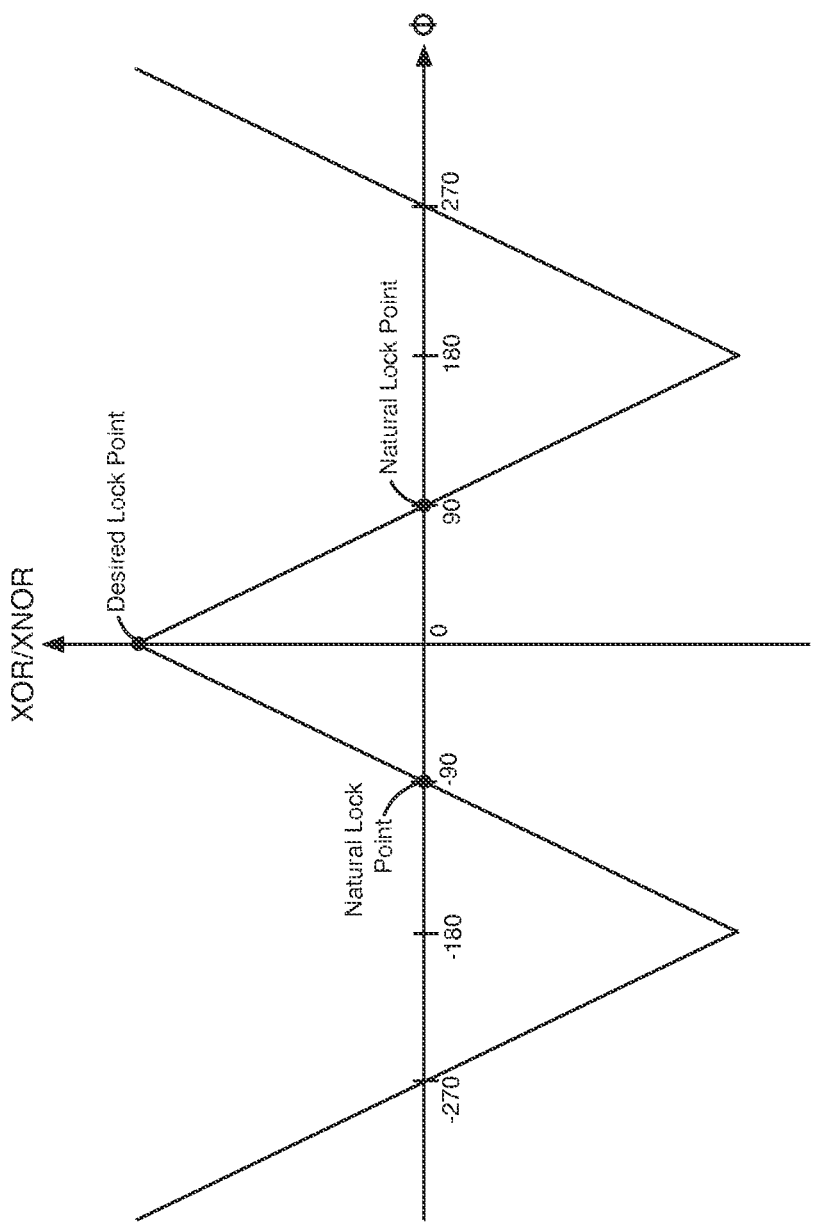
FIG. 11 is a graph that illustrates the output response of the phase detector shown in FIG. 10.

FIG. 11 is a graph that illustrates the output response of phase detector 1000 shown in FIG. 10. The vertical axis shown in FIG. 11 indicates the voltage of the differential output signal XOR/XNOR of phase detector 1000. The horizontal axis shown in FIG. 11 indicates the phase difference φ between the differential input signals AP/AN and BP/BN of phase detector 1000 in degrees.

When phase detector 1000 is used in a conventional DLL, the differential output voltage XOR/XNOR of phase detector 1000 converges to a natural lock point of zero volts. As shown in FIG. 11, two of the natural lock points occur when the phase difference between differential input signals AP/AN and BP/BN is +/−90°, and the differential output voltage XOR/XNOR of phase detector 1000 is zero.

When phase detector 1000 is used as phase detector 901 in DLL 900, the differential output voltage XOR/XNOR of phase detector 1000 converges to the desired lock point shown in FIG. 11. The desired lock point occurs at a peak inflection point of the output voltage response of XOR/XNOR that is generated in response to a phase difference of 0° between differential input signals AP/AN and BP/BN.

The circuitry described herein can be used in any suitable integrated circuit, such as, for example, a memory integrated circuit, a controller integrated circuit, a processor integrated circuit, an analog integrated circuit, a digital integrated circuit, etc.

According to an embodiment, a feedback loop circuit comprises a phase detector, a loop filter, and a phase adjustment circuit. The phase detector detects a phase relationship between first and second clock signals. The loop filter generates an output signal based on an output signal of the phase detector. The feedback loop circuit operates such that the output signal of the loop filter converges to where an average value of the output signal of the phase detector is at a maximum value or an inflection point. The phase adjustment circuit adjusts a phase of the second clock signal in response to the output signal of the loop filter. The phase adjustment circuit can comprise a resonant buffer circuit, an oscillator, a delay line, or a phase interpolator circuit. The phase detector can comprise a quadrature phase detector, such as an XOR based phase detector, or a phase mixer circuit. The feedback loop circuit can be a DLL or a phase-locked loop (PLL). In the case of a PLL, the digitally adjustable delay may be replaced by a digitally controlled oscillator (DCO), such as a resonant tank oscillator or a ring oscillator.

According to another embodiment, a feedback loop circuit comprises a quadrature phase detector, a loop filter, and a phase adjustment circuit. The quadrature phase detector detects a phase relationship between first and second clock signals. The loop filter generates an output signal based on an output signal of the quadrature phase detector. The feedback loop circuit operates such that the output signal of the loop filter converges to where the first and the second clock signals are in phase. The phase adjustment circuit adjusts a phase of the second clock signal in response to the output signal of the loop filter. The loop filter can comprise a differentiator circuit. The feedback loop circuit can be a DLL or a PLL.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:
1. A circuit comprising:
a phase detector input circuit to receive first and second periodic signals and to generate phase detector input signals, the phase detector input signals comprising the first periodic signal and a delayed second periodic signal when a clock signal is in a first logic state, and the phase detector input signals comprising the second periodic signal and a delayed first periodic signal when the clock signal is in a second logic state;
a phase detector to receive the phase detector input signals and to generate a phase comparison signal indicative of a phase difference between the first and second periodic signals, wherein the phase comparison signal has a non-zero value in response to the phase detector input signals being aligned in phase; and
an output circuit to receive the phase comparison signal and to generate based on the phase comparison signal, an output signal having a zero value when the first and the second periodic signals are aligned in phase.

2. The circuit of claim 1, wherein the phase detector input signals comprise a first phase detector input signal and a second phase detector input signal, the phase detector input circuit comprises:

a first chopper switch circuit to alternately switch the first and second periodic signals between a first output of the first chopper switch circuit providing the first phase detector input signal and a second output of the first chopper switch circuit providing a delay circuit input signal, the first chopper switch circuit switching based on the clock signal; and a delay circuit coupled to the second output of the first chopper switch circuit, the delay circuit to apply a delay to the delay circuit input signal to generate the second phase detector input signal.

3. The circuit of claim 1, wherein the output circuit comprises:

an inverting circuit to invert the phase comparison signal to generate an inverted phase comparison signal;

a switch circuit to alternately switch the phase comparison signal and the inverted phase comparison to an output of the switch circuit, the switch circuit switching based on the clock signal; and a low pass filter circuit to filter the output of the switch circuit to generate the output signal having the zero value when the first and the second periodic signals are aligned in phase.

4. The circuit of claim 1, wherein the phase comparison signal comprises a differential phase comparison signal having a non-inverted component and an inverted component, wherein the output circuit comprises:

a second chopper switch circuit to alternately switch the non-inverted and inverted components of the differential phase comparison signal between a first output of the second chopper switch circuit and a second output of the second chopper switch circuit, the second chopper switch circuit outputting a differential output signal, the second chopper switch circuit switching based on the clock signal; and a load circuit to low pass filter the differential output signal to generate the output signal.

5. The circuit of claim 4, wherein the phase detector comprises a pull-down network of transistors, and wherein the second chopper switch circuit is coupled between the load circuit and the pull-down network of transistors.

6. The circuit of claim 4, wherein the phase detector comprises an XOR based phase detector outputting the phase comparison signal as a differential current signal.

7. The circuit of claim 1, wherein the phase detector input signals comprise a first phase detector input signal and a second phase detector input signal, the phase detector input circuit comprises:

a first chopper switch circuit to alternately switch the first and second periodic signals between a first output of the first chopper switch circuit providing a non-delayed signal and a second output of the first chopper switch circuit providing a delay circuit input signal, the first chopper switch circuit switching based on the clock signal;

a delay circuit coupled to the second output of the first chopper switch circuit, the delay circuit to apply a delay to the delay circuit input signal to generate a delayed signal; and a second chopper switch circuit to alternately switch the non-delayed signal and the delayed signal between a first output of the second chopper switch circuit providing the first phase detector input signal and a second output of the second chopper switch circuit providing the second phase detector input signal, the second chopper switch circuit switching based on the clock signal.

8. The circuit of claim 1, wherein the output circuit comprises:

a first sample and hold circuit to sample the phase comparison signal and generate a first sampled signal when the clock signal is in the first logic state; and a second sample and hold circuit to sample the phase comparison signal and generate a second sampled signal when the clock signal is in the second logic state; and a combiner circuit to subtract the second sampled signal from the first sampled signal to generate the output signal.

9. The circuit of claim 1, further comprising:

a loop filter circuit to filter the output signal from the output circuit to generate a filtered signal;

a variable frequency oscillator circuit to generate a periodic feedback signal that varies based on the filtered signal; and wherein the first periodic signal comprises a reference signal and wherein the second periodic signal is based on the feedback signal.

10. The circuit of claim 1, further comprising:

a loop filter circuit to filter the output signal from the output circuit to generate a filtered signal; and a variable delay circuit to apply a variable delay to the first periodic signal based on the filtered signal to generate a the second periodic signal.

11. The circuit of claim 1, wherein the circuit is embedded in an integrated circuit.

12. A method comprising:

receiving first and second periodic signals at an input circuit;

when a clock signal is in a first logic state, applying by a delay circuit, a predefined delay to the first periodic signal to generate a delayed first signal and providing the delayed first signal and second periodic signal as phase detector input signals to a phase detector;

when the clock signal is in a second logic state, applying by the delay circuit, the predefined delay to the second periodic signal to generate a delayed second signal and providing the first periodic signal and the delayed second signal as the phase detector input signals to the phase detector;

generating, by the phase detector, a phase comparison signal indicative of a phase difference between the first and second periodic signals, wherein the phase comparison signal has a non-zero value in response to the phase detector input signals being aligned in phase; and generating, based on the phase comparison signal, an output signal having a zero value when the first and the second periodic signals are aligned in phase.

13. The method of claim 12, further comprising:

alternately switching the first and second periodic signals between a first output of a first chopper switch circuit coupled to the phase detector and a second output of the first chopper switch circuit coupled to the delay circuit, the switching based on the clock signal.

14. The method of claim 12, wherein generating the output signal comprises:

inverting the phase comparison signal to generate an inverted phase comparison signal;

alternately switching the phase comparison signal and the inverted phase comparison to an output of a switch circuit, the switch circuit switching based on the clock signal; and low pass filtering the output of the switch circuit to generate the output signal having the zero value when the first and the second periodic signals are aligned in phase.

15. The method of claim 12, wherein generating the phase comparison signal comprises generating a differential phase comparison signal comprising a non-inverted component and an inverted component, wherein generating the output signal comprises:
   alternately switching the non-inverted and inverted components of the phase comparison signal between a first output of a second chopper switch circuit and a second output of the second chopper switch circuit to produce a differential output signal, the switching based on the clock signal; and
   low pass filtering the differential output signal to generate the output signal.

16. The method of claim 15, wherein generating the phase comparison signal comprises applying an XOR based phase detector outputting the phase comparison signal as a differential current signal.

17. The method of claim 12, further comprising:
   alternately switching the first and second periodic signals between a first output of a first chopper switch circuit coupled to a conductor and a second output of the first chopper switch circuit coupled to the delay circuit, the first chopper switch circuit switching based on the clock signal; and
   alternately switching a non-delayed signal from the conductor and a delayed signal from the delay circuit between a first output of a second chopper switch circuit coupled to the phase detector and a second output of the second chopper switch circuit coupled to the phase detector, the switching based on the clock signal.

18. The method of claim 12, wherein generating the output signal comprises:
   sampling the phase comparison signal to generate a first sampled signal when the clock signal is in the first logic state;
   sampling the phase comparison signal to generate a second sampled signal when the clock signal is in the second logic state; and
   subtracting the second sampled signal from the first sampled signal to generate the output signal.

19. The method of claim 12, further comprising:
   loop filtering the output signal to generate a filtered signal;
   generating a periodic feedback signal that varies based on the filtered signal; and
   generating the second periodic signal based on the feedback signal.

20. The method of claim 12, further comprising:
   loop filtering the output signal to generate a filtered signal; and
   applying a variable delay to the first periodic signal based on the filtered signal to generate the second periodic signal.

* * * * *